(12) United States Patent
Weng

(10) Patent No.: US 11,183,428 B1
(45) Date of Patent: Nov. 23, 2021

(54) METHOD FOR MANUFACTURING TRANSISTOR DEVICE

(71) Applicant: Shanghai Huali Integrated Circuit Corporation, Shanghai (CN)

(72) Inventor: Wenyin Weng, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 17/096,006

(22) Filed: Nov. 12, 2020

(30) Foreign Application Priority Data

Jun. 30, 2020 (CN) .......................... 202010610484.7

(51) Int. Cl.
*H01L 21/8234* (2006.01)
*H01L 27/092* (2006.01)
*H01L 21/02* (2006.01)

(52) U.S. Cl.
CPC .. *H01L 21/823431* (2013.01); *H01L 21/0245* (2013.01); *H01L 21/02293* (2013.01); *H01L 21/02532* (2013.01); *H01L 27/0924* (2013.01)

(58) Field of Classification Search
CPC ........... H01L 21/02293; H01L 21/0245; H01L 21/02532; H01L 21/02603; H01L 21/8234; H01L 21/823412; H01L 21/823431; H01L 21/823437; H01L 21/8238; H01L 21/823807; H01L 21/823821; H01L 21/823828; H01L 21/8239; H01L 27/092; H01L 27/0924; H01L 29/413; H01L 29/42384; H01L 29/42392; H01L 29/66545; H01L 29/66795; H01L 29/785; H01L 29/7851; H01L 29/78696; H01L 29/792; B82Y 40/00

See application file for complete search history.

(56) References Cited

U.S. PATENT DOCUMENTS

2021/0083055 A1\* 3/2021 Liaw ............... H01L 21/823412

\* cited by examiner

*Primary Examiner* — Cheung Lee
(74) *Attorney, Agent, or Firm* — Banner & Witcoff, Ltd.

(57) ABSTRACT

A method for manufacturing a transistor device includes a field oxide layer isolates an active region of a core device region from an active region of an input/output device region on a semiconductor substrate, the active region of the core device region is exposed by means of a mask layer, a gate-all-around structure is formed in the active region of the core device region, and a fin gate structure is formed in the active region of the input/output device region, thereby the on-current and off-current performance of the input/output device is not affected when the short channel effect of the core device is improved.

10 Claims, 8 Drawing Sheets

METHOD FOR MANUFACTURING TRANSISTOR DEVICE

CROSS-REFERENCES TO RELATED APPLICATIONS

This application claims priority to Chinese Patent Application No. 202010610484.7, filed on Jun. 30, 2020, and entitled "Method For Manufacturing Transistor Device", the disclosure of which is incorporated herein by reference in entirety.

TECHNICAL FIELD

The present application relates to the field of semiconductor integrated circuits, in particular to manufacturing technology of a transistor device.

BACKGROUND

In the existing advanced logic chips, there usually exist an n-type field-effect transistor (FET), i.e., nFET, and a p-type field-effect transistor, i.e., pFET, and there usually exist nFET and pFET serving as core devices and nFET and pFET serving as input/output (I/O) devices. Referring to FIG. 1, which is a structural schematic diagram of an existing transistor device, it can be seen from FIG. 1 that, a field oxide layer 101 is formed in a semiconductor substrate 100, and the field oxide layer 101 is usually formed by means of a shallow trench isolation (STI) process. The field oxide layer 101 isolates active regions from each other, the active regions include an active region of a core device region that core devices are formed in and an active region of an input/output device region that input/output devices are formed in. As can be seen from FIG. 1, a gate structure 131 of a core nFET and a gate structure 141 of a core pFET are formed in the active region of the core device region, and a gate structure 111 of an input/output nFET and a gate structure 121 of an input/output pFET are formed in the active region of the input/output device region. Each of the gate structures includes a polysilicon gate 112, a hard mask layer formed by stacking a nitride layer 113 and an oxide layer 114, and a side wall 115. A channel region is formed on the surface of the semiconductor substrate 100 of a region covered by the polysilicon gate 112, as can be seen from FIG. 1, the channel length of the input/output device is greater than the channel length of the core device.

With the continuous development of semiconductor technologies, the planar device as shown in FIG. 1 can no longer meet the demand for high-performance devices of users. In this case, the fin field-effect transistor (FinFET) comes into being, which is a three-dimensional device, and compared with planar transistors, the fin field-effect transistor has a three-dimensional channel structure, thus having better on-current and off-current characteristics and being able to improve the short channel effect (SCE). The FinFET generally includes a fin, which is formed by a nanostrip or nanosheet formed on a semiconductor substrate. The fins on the same semiconductor substrate are arranged in parallel, and a dielectric layer is isolated between the fins. A gate structure covers a partial length of the top surface and side surfaces of the fin, and the surface of the fin covered by the gate structure is used to form a channel, that is, channels are provided on the top surface and two side surfaces of the fin. Generally, the gate structure includes a gate dielectric layer and a gate conductive material layer which are stacked up. A source region and a drain region are formed in the fins on two sides of the gate structure.

With the development of semiconductor technologies, the device size decreases continuously. At the technology node below 5 nm, the fin field-effect transistor adopts a nanowire or nanosheet gate-all-around (GAA) structure, which can further improve the short channel effect. Referring to FIG. 2, which is a schematic diagram of a gate-all-around structure, as can be seen from FIG. 2, the gate-all-around structure includes a wire 144 formed on a fin 110 on a semiconductor substrate. A channel region of the semiconductor device is formed in the wire 144, and a gate dielectric layer 122 is formed on the peripheral of the wire 144. A work function layer 133 is formed on the peripheral of the gate dielectric layer 122 and between the gate dielectric layer 122 and the semiconductor substrate. The GAA structure can effectively improve the short channel effect of the device.

As can be seen from FIG. 2, there are two wires 144 vertically stacked on the fin 110, and there is a gap between the two wires 144. Referring to FIG. 2, assuming that the diameter d1 of the wire 144 is 10 nm and the gap d2 between the two wires 144 is 20 nm, then the thickness of the gate dielectric layer 122 is necessarily less than 5 nm; if the thickness of the gate dielectric layer 122 is greater than 5 nm, the gate dielectric layers 122 overlap, as can be seen from FIG. 3, which is a schematic diagram of the gate-all-around structure in which a gate dielectric layer is relatively thick, in which case the on-current/off-current ($I_{on}/I_{off}$) characteristics of the device are affected, and the size of the wire 144 needs to be sacrificed to increase the thickness of the gate dielectric layer 122. Therefore, for input/output (I/O) devices, the GAA structure may affect the device performance thereof.

BRIEF SUMMARY OF THE DISCLOSURE

According to some embodiments in this application, a method for manufacturing a transistor device is disclosed in the following steps: S1: providing a semiconductor substrate, wherein a field oxide layer is formed in the semiconductor substrate, the field oxide layer isolates active regions from each other, the active regions include an active region of a core device region that core devices are formed in and an active region of an input/output device region that input/output devices are formed in; S2: forming an epitaxial layer on the surface of the semiconductor substrate, wherein the epitaxial layer includes at least one stacking layer formed by a silicon-germanium epitaxial layer and a silicon epitaxial layer; S3: performing photolithography process and etching process to form a plurality of fins that are strip structure, wherein the plurality of fins include fins in the input/output device region and fins in the core device region, and all of the fins are arranged in parallel; S4: forming a first insulation layer on the semiconductor substrate, wherein the first insulation layer isolates the bottoms of the plurality of fins from each other; S5: forming a polysilicon layer, and performing photolithography process and etching process to form a plurality of polysilicon gates, wherein the polysilicon gate covers a portion of the top surface and the side surface of the fin, the portion of the fin covered by the polysilicon gate is used to form a channel region, and side walls are formed on two sides of the polysilicon gate; S6: forming a source and a drain on the fin, wherein the source is located on one side of the polysilicon gate and the drain is located on the other side of the polysilicon gate; S7: forming an interlayer dielectric layer, and performing a planarization process, and removing the polysilicon gate; S8: forming a mask layer, and performing exposure and development process, to expose the core device region and to protect the input/output device region by means of the mask layer; S9: performing an etching process to remove the silicon-germanium epitaxial layer in the fins in the core device region and to form a wire formed by the silicon epitaxial layer; S10: removing the mask layer, forming a gate dielectric layer, the gate dielectric layer coating the peripheral of the wire, the surface of the fin in the input/output device region, and the exposed surfaces of the first insulation layer and a semiconductor material, and forming a work function layer, wherein the work function layer covers the surface of the gate dielectric layer and fills a gap between the gate dielectric layers on the same fin; and S11: forming a metal gate, wherein the metal gate fills a region from which the polysilicon gate is removed, such that the wire, gate dielectric layer, and work function layer in the core device region and the metal gate form a gate-all-around structure, and the fin, gate dielectric layer, and work function layer in the input/output device region and the metal gate form a fin gate structure.

DETAILED DESCRIPTION OF THE DISCLOSURE

Figure 1:
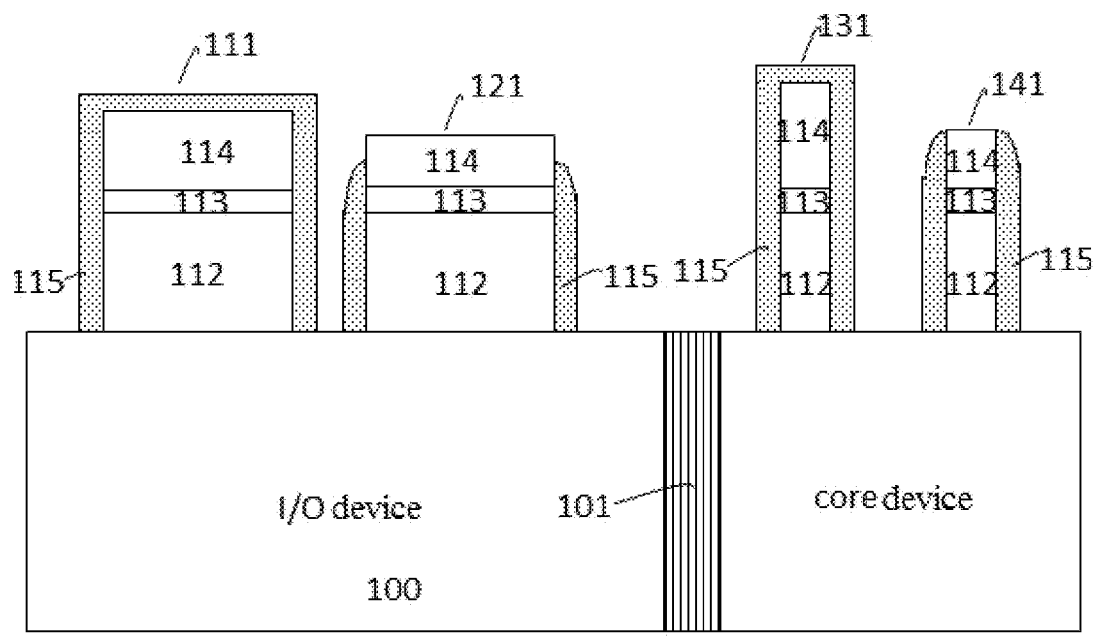
FIG. 1 is a structural schematic diagram of an existing transistor device.
Figure 2:
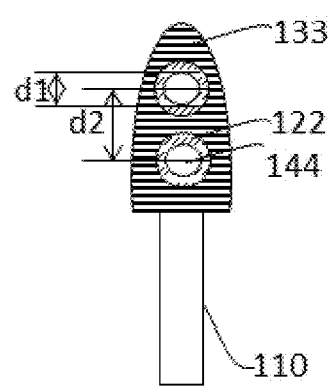
FIG. 2 is a schematic diagram of a gate-all-around structure.
Figure 3:
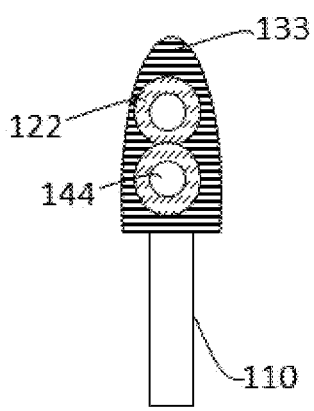
FIG. 3 is a schematic diagram of the gate-all-around structure in which a gate dielectric layer is relatively thick.

The technical solution of the present application will be clearly and completely described below with reference to the drawings. Obviously, the described embodiments are part of the embodiments of the present application, instead of all of them. Based on the embodiments in the present application, all other embodiments obtained by one skilled in the art without contributing any inventive labor shall fall into the protection scope of the present application.

One embodiment of the present application provides a method for manufacturing a transistor device, including steps of: S1: providing a semiconductor substrate, wherein a field oxide layer is formed in the semiconductor substrate, the field oxide layer isolates active regions from each other, the active regions include an active region of a core device region that core devices are formed in and an active region of an input/output device region that input/output devices are formed in; S2: forming an epitaxial layer on the surface of the semiconductor substrate, wherein the epitaxial layer includes at least one stacking layer formed by a silicon-germanium epitaxial layer and a silicon epitaxial layer; S3: performing photolithography process and etching process to form a plurality of fins that are strip structure, wherein the plurality of fins include fins in the input/output device region and fins in the core device region, and all of the fins are arranged in parallel; S4: forming a first insulation layer on the semiconductor substrate, wherein the first insulation layer isolates the bottoms of the plurality of fins from each other; S5: forming a polysilicon layer, and performing photolithography process and etching process to form a plurality of polysilicon gates, wherein the polysilicon gate covers a portion of the top surface and the side surface of the fin, the portion of the fin covered by the polysilicon gate is used to form a channel region, and side walls are formed on two sides of the polysilicon gate; S6: forming a source and a drain on the fin, wherein the source is located on one side of the polysilicon gate and the drain is located on the other side of the polysilicon gate; S7: forming an interlayer dielectric layer, and performing a planarization process, and removing the polysilicon gate; S8: forming a mask layer, and performing exposure and development process, to expose the core device region and to protect the input/output device region by means of the mask layer; S9: performing an etching process to remove the silicon-germanium epitaxial layer in the fins in the core device region and to form a wire formed by the silicon epitaxial layer; S10: removing the mask layer, forming a gate dielectric layer, the gate dielectric layer coating the peripheral of the wire, the surface of the fin in the input/output device region, and the exposed surfaces of the first insulation layer and a semiconductor material, and forming a work function layer, wherein the work function layer covers the surface of the gate dielectric layer and fills a gap between the gate dielectric layers on the same fin; and S11: forming a metal gate, wherein the metal gate fills a region from which the polysilicon gate is removed, such that the wire, gate dielectric layer, and work function layer in the core device region and the metal gate form a gate-all-around structure, and the fin, gate dielectric layer, and work function layer in the input/output device region and the metal gate form a fin gate structure.

Figure 4:
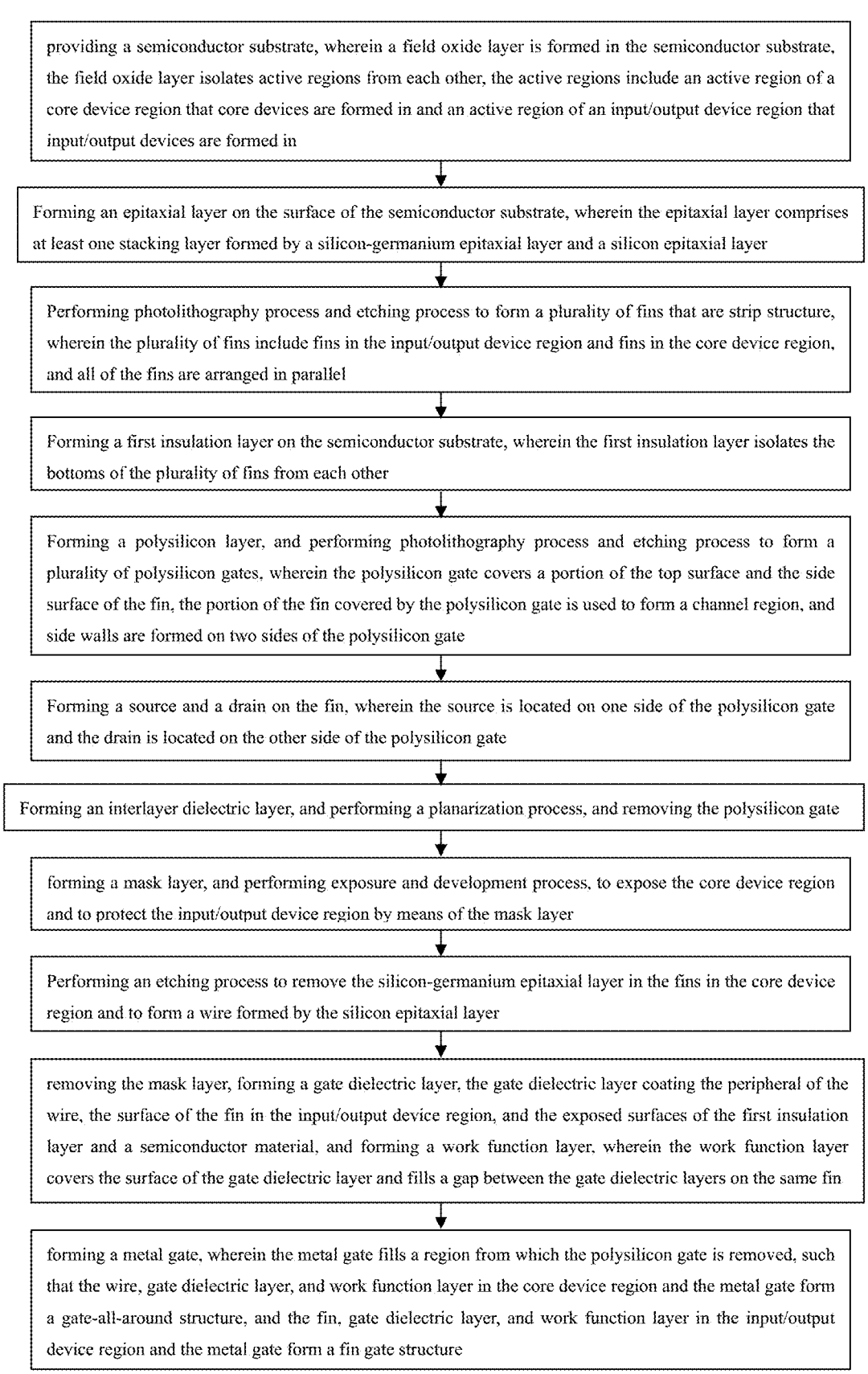
FIG. 4 is a flowchart of a method for manufacturing a transistor device according to an embodiment of the present application.
Figure 5:
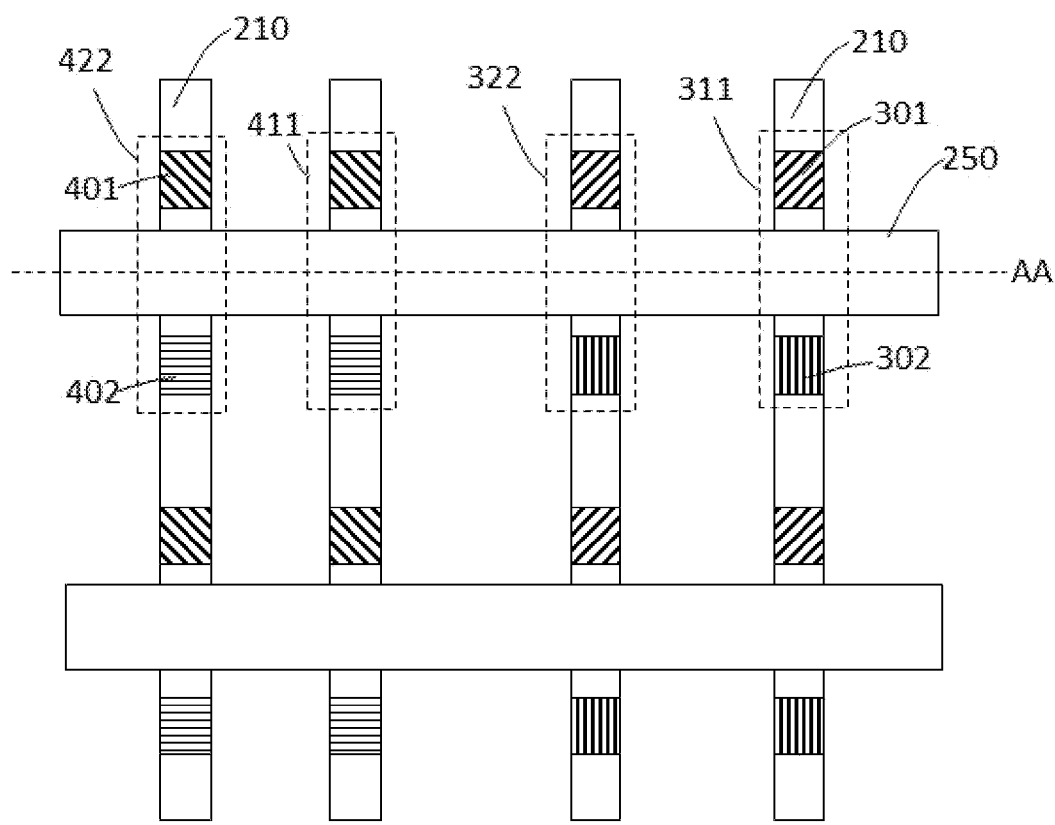
FIG. 5 is a planar schematic diagram of a transistor device manufactured by using the method for manufacturing a transistor device as shown in FIG. 4 according to an embodiment of the present application.

Referring to FIGS. 4, 5, and 6a-6h, it can be seen that FIG. 4 is a flowchart of a method for manufacturing a transistor device according to an embodiment of the present application, FIG. 5 is a planar schematic diagram of a transistor device manufactured by using the method for manufacturing a transistor device as shown in FIG. 4 according to an embodiment of the present application, FIGS. 6a-6h are sectional diagrams of the transistor device manufactured by using the method for manufacturing a transistor device as shown in FIG. 4 according to an embodiment of the present application, and FIGS. 6a-6h are sectional diagrams obtained by cutting the transistor device along the dashed line AA in FIG. 5. The method for manufacturing a transistor device of the present application includes the following steps.

Figure 6A:
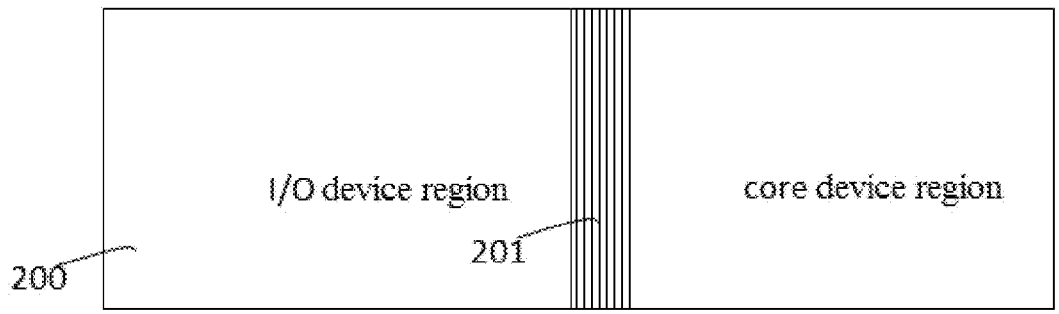
FIGS. 6a-6h are sectional diagrams of the transistor device manufactured by using the method for manufacturing a transistor device as shown in FIG. 4 according to an embodiment of the present application.

S1: Referring to FIG. 6a, a semiconductor substrate 200 is provided, wherein a field oxide layer 201 is formed in the semiconductor substrate 200, the field oxide layer 201 isolates active regions from each other, the active regions include an active region of a core device region that core devices are formed in and an active region of an input/output device region that input/output devices are formed in.

In an embodiment, the semiconductor substrate 200 is a silicon substrate. In an embodiment, the field oxide layer 201 is generally formed by means of a shallow trench isolation process.

Figure 6B:
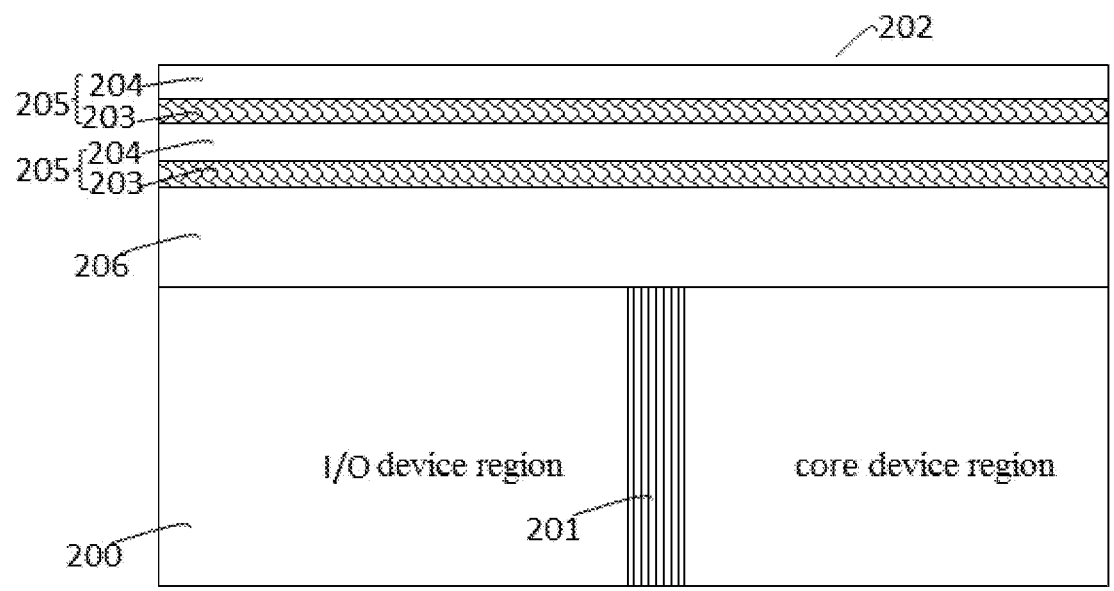

S2: Referring to FIG. 6b, an epitaxial layer 202 is formed on the surface of the semiconductor substrate 200, wherein the epitaxial layer includes at least one stacking layer 205 formed by a silicon-germanium (SiGe) epitaxial layer 203 and a silicon (Si) epitaxial layer 204.

In an embodiment, the epitaxial layer further includes a semiconductor layer 206 between the semiconductor substrate 200 and the stacking layer 205.

Figure 6C:
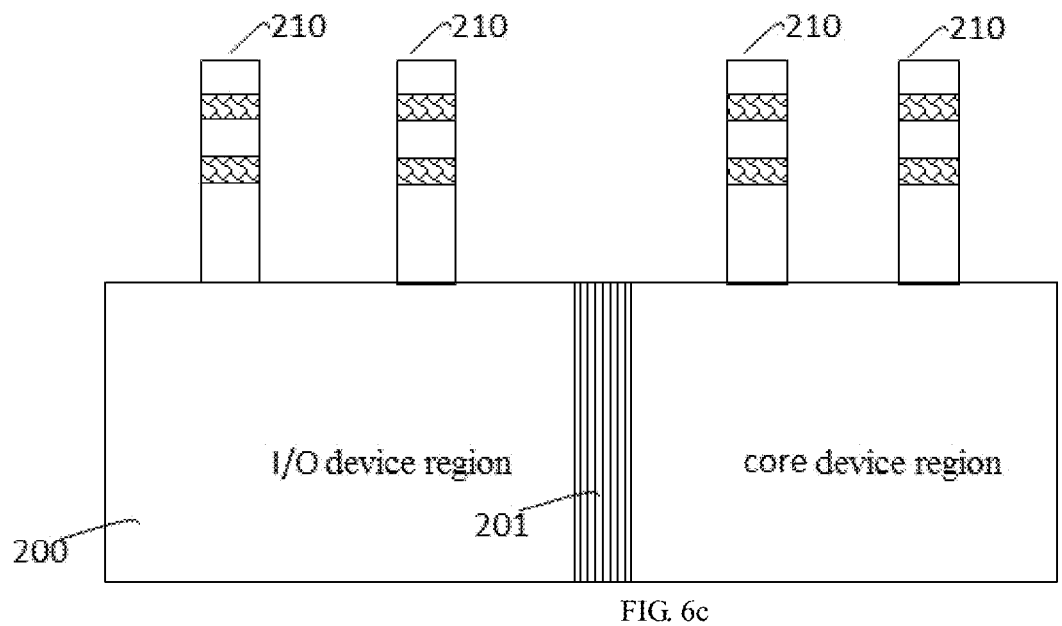

S3: Referring to FIG. 6c, photolithography process and etching process are performed to form a plurality of fins 210 that are strip structure, wherein the plurality of fins 210 include fins in the input/output device region and fins in the core device region, and all of the fins 210 are arranged in parallel.

In an embodiment, photolithography process and etching process are performed to the epitaxial layer 202 to form the plurality of fins 210 that are strip structure.

Figure 6D:
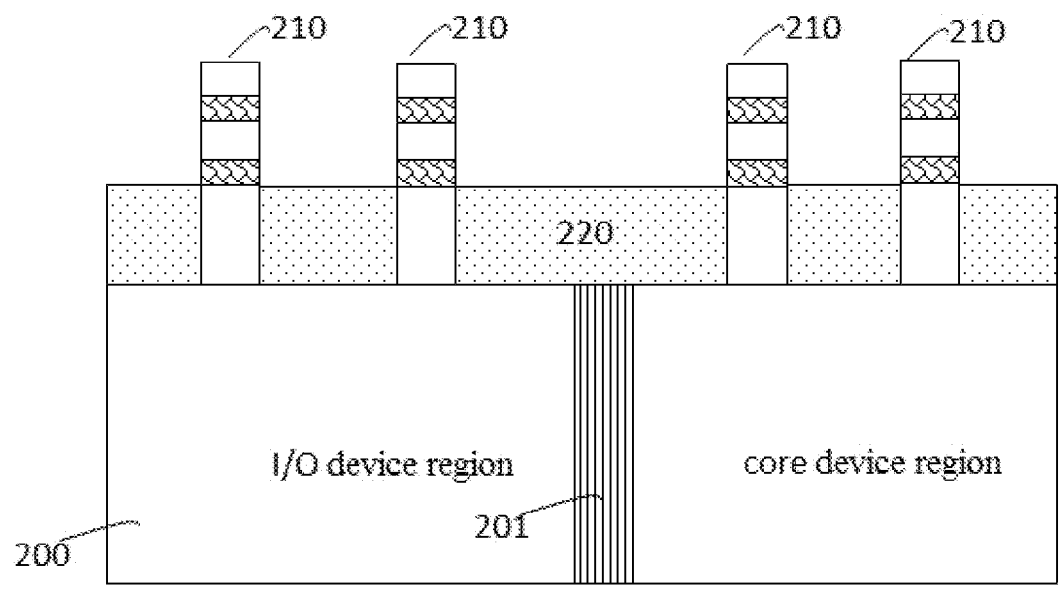

S4: Referring to FIG. 6d, a first insulation layer 220 is formed on the semiconductor substrate 200, wherein the first insulation layer 220 isolates the bottoms of the plurality of fins 210 from each other.

In an embodiment, the first insulation layer 220 is an oxide layer and can be formed by means of a chemical vapor deposition process.

In an embodiment, the first insulation layer 220 isolates the semiconductor layers 206 from each other.

Figure 6E:
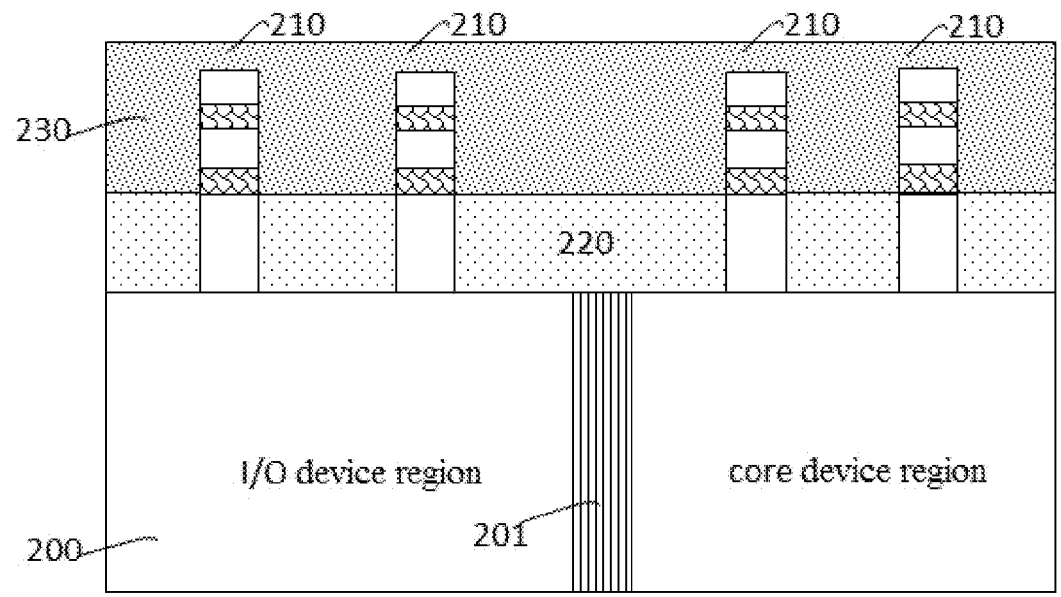

S5: Referring to FIG. 6e, a polysilicon layer is formed, and photolithography process and etching process are performed to form a plurality of polysilicon gates 230, wherein the polysilicon gate 230 covers a portion of the top surface and the side surface of the fin 210, the portion of the fin 210 covered by the polysilicon gate 230 is used to form a channel region, and side walls are formed on two sides of the polysilicon gate.

In an embodiment, before the polysilicon layer is formed, an oxide layer is formed on the surface of the fins 210 and the surface of the first insulation layer 220.

S6: A source and a drain are formed on the fin 210, wherein the source is located on one side of the polysilicon gate and the drain is located on the other side of the polysilicon gate.

Figure 6F:
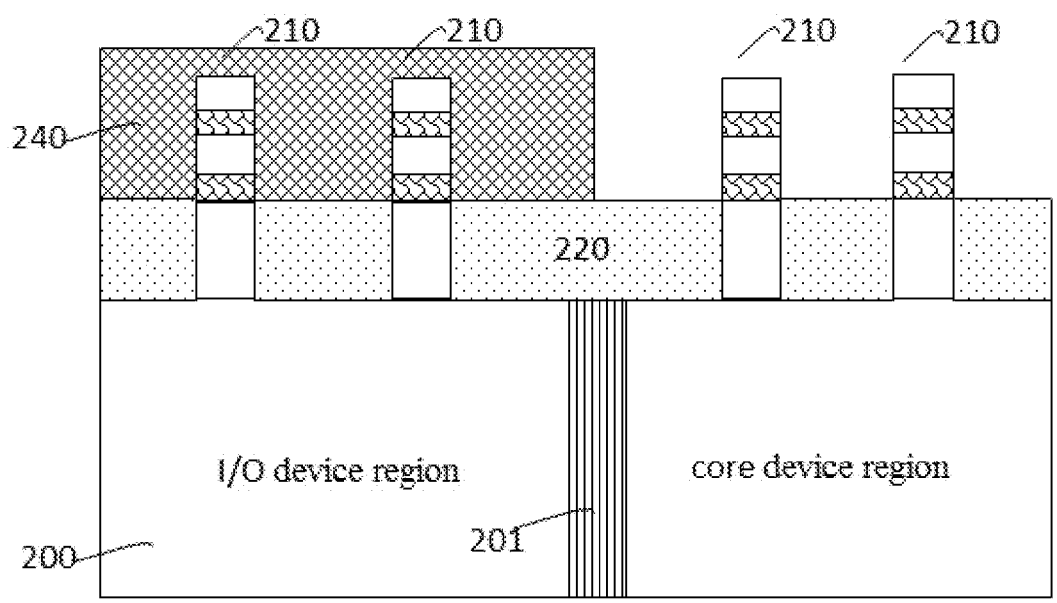

S7: Referring to FIG. 6f, forming an interlayer dielectric layer, performing a planarization process, and removing the polysilicon gate.

S8: Referring to FIG. 6f, forming a mask layer 240, performing exposure and development process, to expose the core device region and to protect the input/output device region by means of the mask layer 240.

Figure 6G:
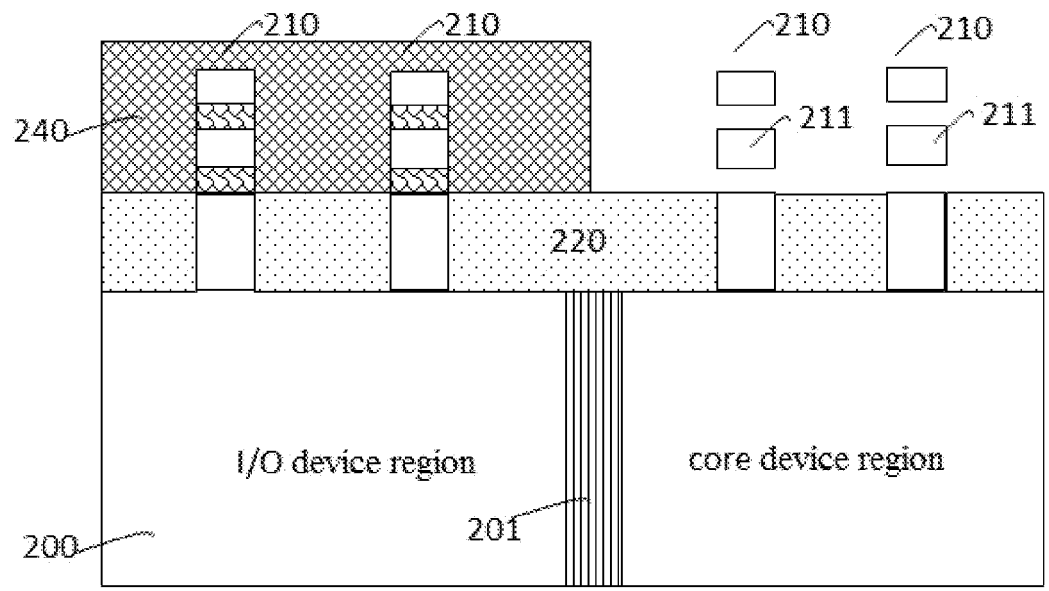

S9: Referring to FIG. 6g, an etching process is performed to remove the silicon-germanium epitaxial layer 203 in the fins 210 in the core device region and to form a wire 211 formed by the silicon epitaxial layer 204.

In an embodiment, there are two vertically stacked wires 211. Moreover, in the present application, there may be more than two vertically stacked wires 211, and the present application makes no limitation thereto.

In an embodiment of the present application, a sectional structure of the wire 211 is a circle, or a polygon such as a square, a rectangle, or a Σ-shape.

Figure 6H:
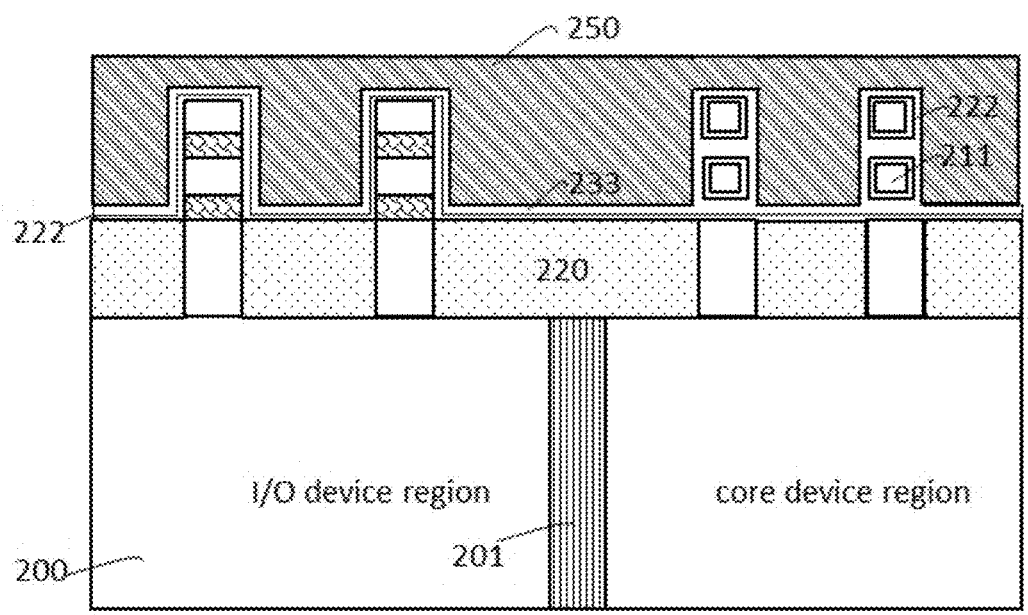

S10: Referring to FIG. 6h, removing the mask layer 240, forming a gate dielectric layer 222, the gate dielectric layer 222 coating the peripheral of the wire 211, the surface of the fin 210 in the input/output device region, and the exposed surfaces of the first insulation layer 220 and a semiconductor material, and forming a work function layer 233, wherein the work function layer 233 covers the surface of the gate dielectric layer 222 and fills a gap between the gate dielectric layers 222 on the same fin.

In an embodiment, the first gate dielectric layer 222 includes a high dielectric constant layer, and the material of the high dielectric constant layer includes silicon dioxide, silicon nitride, aluminum oxide, tantalum pentoxide, yttrium oxide, hafnium silicate, hafnium dioxide, lanthanum oxide, zirconium dioxide, strontium titanate, and zirconium silicate.

S11: Referring to FIG. 6h, forming a metal gate 250, wherein the metal gate 250 fills a region from which the polysilicon gate 230 is removed, such that the wire 211, gate dielectric layer 222, and work function layer 233 in the core device region and the metal gate 250 form a gate-all-around structure, and the fin, gate dielectric layer 222, and work function layer 233 in the input/output device region and the metal gate 250 form a fin gate structure.

In an embodiment, the source 301 and the drain 302 in the core device region and the gate-all-around structure form a gate-all-around structure field-effect transistor serving as a core device, and the source 401 and the drain 402 in the input/output device region and the fin gate structure form a fin field-effect transistor serving as an input/output device.

In an embodiment, the gate-all-around structure field-effect transistor in the core device region includes an n-type gate-all-around structure field-effect transistor 311 and a p-type gate-all-around structure field-effect transistor 322, and the fin field-effect transistor serving as an input/output device includes an n-type fin field-effect transistor 411 and a p-type fin field-effect transistor 422. In an embodiment of the present application, the source and the drain both are embedded structures. The source and the drain of the n-type fin field-effect transistor 411 and the n-type gate-all-around structure field-effect transistor 311 are composed of a first embedded epitaxial layer, and the material of the first embedded epitaxial layer is $Si_xP_y$, $Si_mC_n$, or $SiO_cP_q$, wherein subscripts x, y, m, n, o, p, and q respectively represent the number of corresponding atoms in a material molecule. The source and the drain of the p-type fin field-effect transistor 422 and the p-type gate-all-around structure field-effect transistor 322 are composed of a second embedded epitaxial layer, and the material of the second embedded epitaxial layer is $Si_hGe_i$, wherein subscripts h and i respectively represent the number of corresponding atoms in a material molecule.

In addition, the method for manufacturing a transistor device of the present application is used for manufacturing a device of a technology node below 5 nm.

As described above, in a manufacturing process of a transistor device including a core device and an input/output device, a field oxide layer isolates an active region of a core device region from an active region of an input/output device region on a semiconductor substrate, the active region of the core device region is exposed by means of a mask layer, a gate-all-around structure is formed in the active region of the core device region, and a fin gate structure is formed in the active region of the input/output device region, thereby improving the short channel effect of the core device. In addition, the thickness of a gate dielectric layer of the fin gate structure of the input/output device is not affected by a gap between channel wires of the gate-all-around structure, such that the on-current and off-current performance of the input/output device is not affected when the short channel effect of the core device is improved.

Finally, it should be noted that the above embodiments are only used for describing the technical solutions of the present application, instead of limiting the technical solutions. Although the present application is described in detail with reference to the above embodiments, it should be understood by one skilled in the art that the technical solutions recorded in the above embodiments may still be modified, or some or all of the technical features may be replaced equivalently. These modifications or replacements do not make the essence of the corresponding technical solution deviate from the scope of the technical solutions of the embodiments of the present application.

What is claimed is:

1. A method for manufacturing a transistor device, comprising steps of:
S1: providing a semiconductor substrate, wherein a field oxide layer is formed in the semiconductor substrate, the field oxide layer isolates active regions from each other, the active regions include an active region of a core device region that core devices are formed in and an active region of an input/output device region that input/output devices are formed in;
S2: forming an epitaxial layer on the surface of the semiconductor substrate, wherein the epitaxial layer comprises at least one stacking layer formed by a silicon-germanium epitaxial layer and a silicon epitaxial layer;
S3: performing photolithography process and etching process to form a plurality of fins that are strip structure, wherein the plurality of fins include fins in the input/output device region and fins in the core device region, and all of the fins are arranged in parallel;
S4: forming a first insulation layer on the semiconductor substrate, wherein the first insulation layer isolates the bottoms of the plurality of fins from each other;
S5: forming a polysilicon layer, and performing photolithography process and etching process to form a plurality of polysilicon gates, wherein the polysilicon gate covers a portion of the top surface and the side surface of the fin, the portion of the fin covered by the polysilicon gate is used to form a channel region, and side walls are formed on two sides of the polysilicon gate;
S6: forming a source and a drain on the fin, wherein the source is located on one side of the polysilicon gate and the drain is located on the other side of the polysilicon gate;
S7: forming an interlayer dielectric layer, and performing a planarization process, and removing the polysilicon gate;
S8: forming a mask layer, and performing exposure and development process, to expose the core device region and to protect the input/output device region by means of the mask layer;
S9: performing an etching process to remove the silicon-germanium epitaxial layer in the fins in the core device region and to form a wire formed by the silicon epitaxial layer;
S10: removing the mask layer, forming a gate dielectric layer, the gate dielectric layer coating the peripheral of the wire, the surface of the fin in the input/output device region, and the exposed surfaces of the first insulation layer and a semiconductor material, and forming a work function layer, wherein the work function layer covers the surface of the gate dielectric layer and fills a gap between the gate dielectric layers on the same fin; and
S11: forming a metal gate, wherein the metal gate fills a region from which the polysilicon gate is removed, such that the wire, gate dielectric layer, and work function layer in the core device region and the metal gate form a gate-all-around structure, and the fin, gate dielectric layer, and work function layer in the input/output device region and the metal gate form a fin gate structure.

2. The method for manufacturing the transistor device according to claim 1, wherein the epitaxial layer further comprises a semiconductor layer between the semiconductor substrate and the stacking layer.

3. The method for manufacturing the transistor device according to claim 2, wherein photolithography process and etching process are performed to the epitaxial layer to form the plurality of fins that are strip structure.

4. The method for manufacturing the transistor device according to claim 3, wherein the first insulation layer isolates the semiconductor layers between the semiconductor substrate and the stacking layer from each other.

5. The method for manufacturing the transistor device according to claim 1, wherein in step S5, before the polysilicon layer is formed, an oxide layer is formed on the surface of the fins and the surface of the first insulation layer.

6. The method for manufacturing the transistor device according to claim 1, wherein there are two vertically stacked wires.

7. The method for manufacturing the transistor device according to claim 1, wherein the source and the drain in the core device region and the gate-all-around structure form a gate-all-around structure field-effect transistor serving as a core device, and the source and the drain in the input/output device region and the fin gate structure form a fin field-effect transistor serving as an input/output device.

8. The method for manufacturing the transistor device according to claim 7, wherein the gate-all-around structure field-effect transistor comprises an n-type gate-all-around structure field-effect transistor and a p-type gate-all-around structure field-effect transistor, the fin field-effect transistor comprises an n-type fin field-effect transistor and a p-type fin field-effect transistor, the source and the drain of the n-type fin field-effect transistor and the n-type gate-all-around structure field-effect transistor are composed of a first embedded epitaxial layer, and the source and the drain of the p-type fin field-effect transistor and the p-type gate-all-around structure field-effect transistor are composed of a second embedded epitaxial layer.

9. The method for manufacturing the transistor device according to claim 1, wherein a sectional structure of the wire is a circle or a polygon.

10. The method for manufacturing the transistor device according to claim 1, wherein the method for manufacturing a transistor device is used for manufacturing a device of a technology node below 5 nm.

* * * * *